(12) United States Patent
Townsend

(10) Patent No.: US 9,374,069 B2
(45) Date of Patent: Jun. 21, 2016

(54) SIGNAL PROCESSING

(71) Applicant: Atlantic Inertial Systems Limited, Devon (GB)

(72) Inventor: Kevin Townsend, Cornwall (GB)

(73) Assignee: Atlantic Inertial Systems Limited, Devon (GB)

( * ) Notice: Subject to any disclaimer, the term of this patent is extended or adjusted under 35 U.S.C. 154(b) by 0 days.

(21) Appl. No.: 14/341,216

(22) Filed: Jul. 25, 2014

(65) Prior Publication Data

US 2016/0028380 A1 Jan. 28, 2016

(30) Foreign Application Priority Data

Jul. 26, 2013 (GB) ................................ 1313389.7

(51) Int. Cl.
| | |
|---|---|
| H03K 3/017 | (2006.01) |
| G01C 19/5684 | (2012.01) |
| G01C 19/5776 | (2012.01) |
| H03D 1/18 | (2006.01) |
| H03M 1/12 | (2006.01) |
| H03M 3/00 | (2006.01) |

(52) U.S. Cl.
CPC ............ *H03K 3/017* (2013.01); *G01C 19/5684* (2013.01); *G01C 19/5776* (2013.01); *H03D 1/18* (2013.01); *H03M 1/12* (2013.01); *H03M 3/30* (2013.01)

(58) Field of Classification Search
None
See application file for complete search history.

(56) References Cited

U.S. PATENT DOCUMENTS

| | | | |
|---|---|---|---|
| 5,444,639 A | 8/1995 | White | |
| 5,469,257 A | 11/1995 | Blake et al. | |
| 5,932,804 A | 8/1999 | Hopkin et al. | |
| 6,249,754 B1 | 6/2001 | Neul et al. | |
| 6,282,958 B1 | 9/2001 | Fell et al. | |
| 2003/0200803 A1 | 10/2003 | Platt | |
| 2004/0146127 A1 | 7/2004 | Kent, III et al. | |
| 2006/0238260 A1* | 10/2006 | Demma | G01C 19/56 331/10 |
| 2008/0103725 A1 | 5/2008 | Platt | |
| 2008/0121054 A1 | 5/2008 | Goldenberg et al. | |
| 2009/0320591 A1 | 12/2009 | Johnson | |
| 2011/0179868 A1 | 7/2011 | Kaino et al. | |
| 2013/0081463 A1 | 4/2013 | Townsend et al. | |
| 2013/0141262 A1* | 6/2013 | Hays | G01F 1/8431 341/118 |

FOREIGN PATENT DOCUMENTS

| | | |
|---|---|---|
| EP | 0892246 A2 | 1/1999 |
| GB | 2322196 A | 8/1998 |
| WO | 2004008071 A1 | 1/2004 |
| WO | 2011144899 A1 | 11/2011 |

* cited by examiner

*Primary Examiner* — Cassandra Cox
(74) *Attorney, Agent, or Firm* — Kinney & Lange, P.A.

(57) ABSTRACT

A method of processing an amplitude-modulated analog signal at a carrier frequency $F_c$ comprises: digitizing the analog signal to produce an input bit stream that represents the amplitude of the analog signal; generating an in-phase reference bit stream that is synchronous to the carrier frequency $F_c$ and represents an in-phase digital reference signal substantially in the form of a sine and/or cosine wave; and multiplying the input bit stream with the in-phase reference bit stream to produce an output bit stream representing the amplitude modulation of the analog signal.

18 Claims, 6 Drawing Sheets

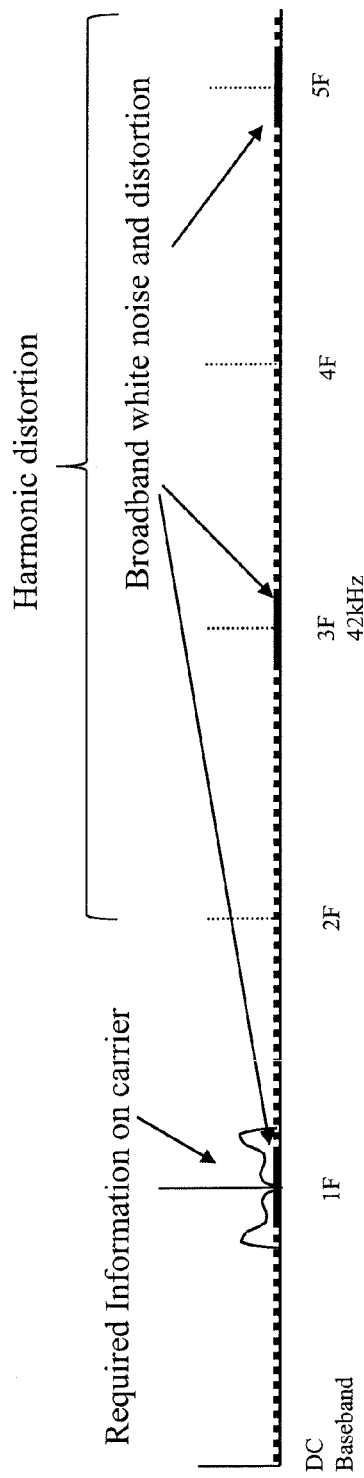
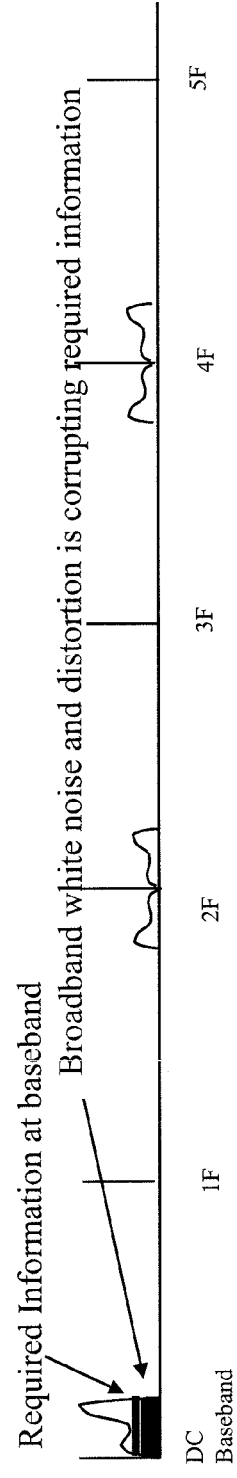
Fig. 4a
Fig. 4b
Fig. 4c

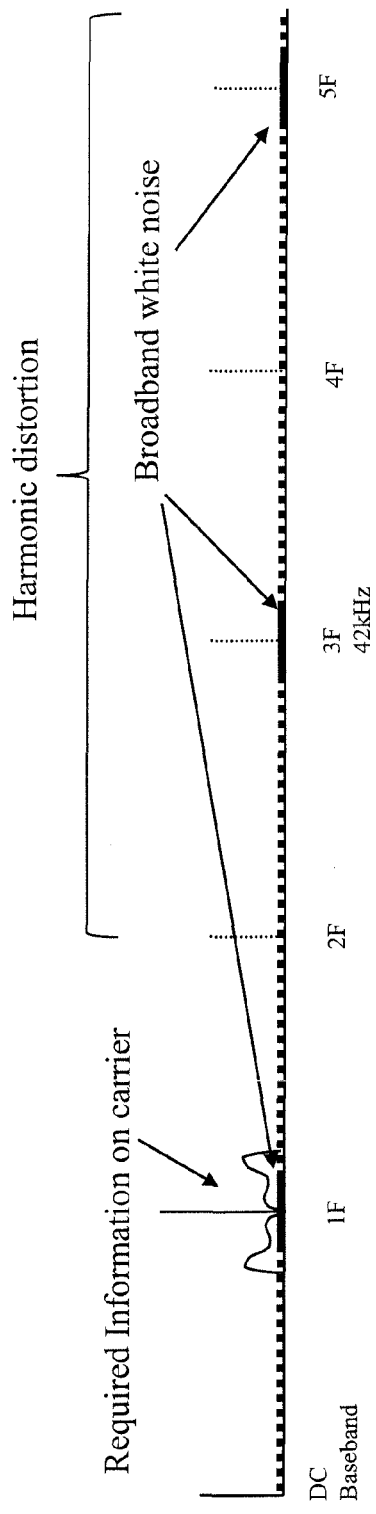
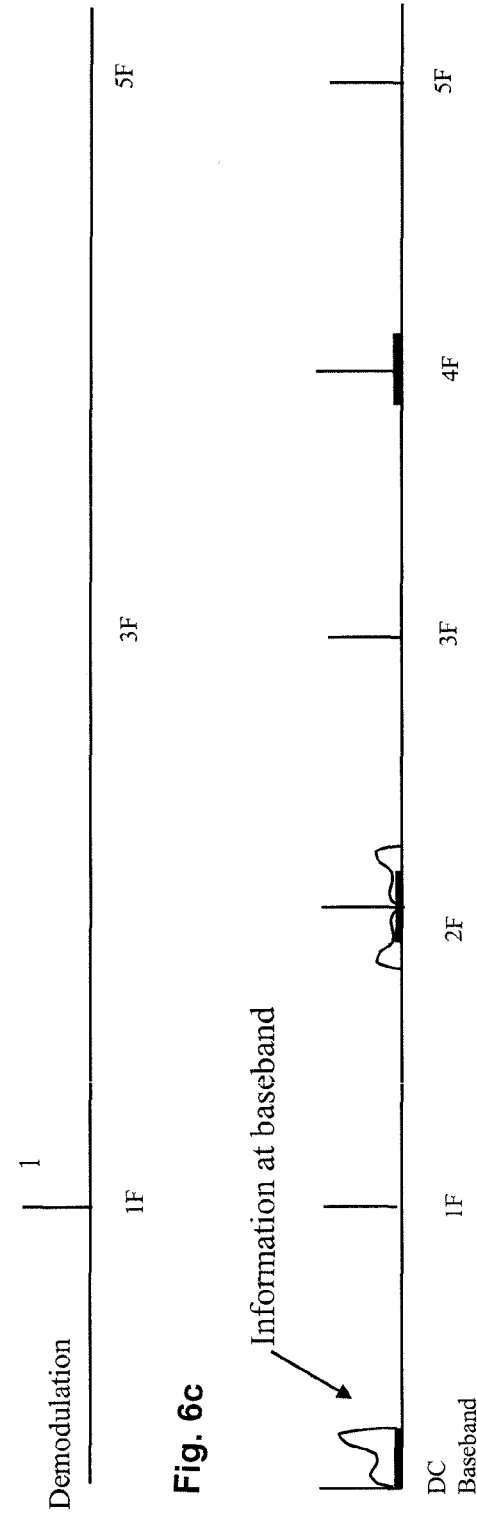
Fig. 6a
Fig. 6b
Fig. 6c

SIGNAL PROCESSING

CROSS-REFERENCE TO RELATED APPLICATION(S)

This application claims priority from United Kingdom Application No. 1313389.7, filed Jul. 26, 2013, entitled SIGNAL PROCESSING, which is incorporated by reference.

BACKGROUND

The present disclosure relates to methods of processing amplitude-modulated analog signals and associated pickoff signal processing systems and sensors. These methods may, for example, find use in conjunction with sensors that comprise a vibrating structure gyroscope, such as a Coriolis-type gyroscope, and that can be used as an annular rate sensor. These methods may be particularly applicable to MEMS sensors as they are capable of being implemented within standard ASIC processes.

Vibrating structure gyroscopes and other sensors may be fabricated using micro-electro-mechanical-systems (MEMS) technology from a semiconductor e.g. silicon substrate. MEMS manufacturing processes are often used to make small mechanical structures at low cost (relative to traditional manufacturing methods). There is considerable interest in utilizing MEMS gyroscopes in a range of guidance, navigation and platform stabilization applications due to their low cost, small size and inherently robust nature. MEMS gyroscopes operate using a mechanical structure excited and controlled by electronic systems. These sensing structures generally vibrate at a carrier frequency $F_c$ in the order of 14 KHz and have useful information contained within side bands extending from a DC component at 0 Hz to a few hundred Hz either side of the carrier frequency. As MEMS structures are generally very small, the signals of interest are also generally very small, and low noise circuitry and signal processing is required to recover the information with sufficient fidelity.

Some examples of vibrating structure gyroscopes may be found in GB 2322196, U.S. Pat. No. 5,932,804 and U.S. Pat. No. 6,282,958. FIG. 1 shows an example of a prior art vibrating structure gyroscope comprising an annular resonator mounted by flexible support beams extending from an inner periphery of the annular resonator to a boss provided by a semiconductor substrate. The flexible support beams allow the annular resonator to vibrate in response to drive signals provided by drive transducers in a substantially undamped oscillation mode and permit the annular resonator to move in response to an annular velocity applied about an axis normal to its plane. The annular resonator is typically excited into a cos 2θ resonance mode. For a perfectly symmetrical resonator, this mode actually exists as a degenerate pair of primary and secondary vibration modes at a mutual angle of 45 degrees. The primary mode is excited as the carrier mode by the drive signal. When the annular resonator is rotated about an axis normal to its plane, the Coriolis effect causes a secondary vibration in an orthogonal direction that pulls energy into the secondary mode. The amplitude of motion of the secondary mode is proportional to the applied annular velocity and measured by a pickoff signal.

In such a Coriolis-type gyroscope, a quadrature bias may arise due to an imperfect matching of the primary and secondary frequencies in the cos 2θ vibration mode pair. The magnitude of the quadrature bias is proportional to $\Delta F \cdot \sin 4\alpha$, where $\Delta F$ is the mode frequency split and a is the mode angular alignment with respect to the primary drive axis. The quadrature bias represents a significant error which appears as a large carrier frequency but at 90 degrees phase (phase quadrature) to the expected mechanical vibration. This quadrature bias signal can be several orders of magnitude larger than the pickoff signals of real interest. A processing system for the pick off signals must have a large dynamic range, good linearity and very good phase accuracy to enable an accurate discrimination of the in-phase and quadrature components.

For a vibrating structure gyroscope, the resultant pickoff signal can be considered as an amplitude-modulated analog signal. A processing system must provide for accurate reconstruction of the amplitude and phase of the modulation from DC to the bandwidth of interest (a few hundred Hz). The processing system must also have the ability to reject the large carrier component which has a quadrature phase relationship to the signal of interest, including a quadrature DC component. A low noise, wide dynamic range but accurate phase sensitive detector is therefore required.

In the prior art, accurately phased electronics can enable the quadrature signal to be substantially rejected. However, practical limitations on the accuracy of an analog phase sensitive detector mean that some of the quadrature signal will typically remain and contaminate the true in-phase signal representing the angular rate. WO 2011/144899 provides an example of a typical rate sensor architecture of the type seen in FIG. 2. An analog pickoff signal is input to the annular rate channel including a synchronous detector. The synchronous detector outputs an offset relative to the amplitude of the pickoff signal which is then filtered and converted into a single-ended offset on the rate output signal and input to an analog-to-digital convertor (ADC). The ADC then outputs a digital signal representative of the movement of the annular rate sensor. US 2008/121054 provides another example of annular rate channel output circuitry wherein an analog pickoff signal is amplified and filtered before being converted into a DC voltage by a phase sensitive detector (PSD). The DC voltage is buffered by an amplifier and then converted into digital format by an analog-to-digital convertor (ADC).

FIG. 3 provides an overview of a simple synchronous detector (also known as a synchronous demodulator) which is used in such analog systems to extract the amplitude modulation information from the analog pickoff signal at a carrier frequency $F_c$. It can be seen that a simple pair of +/−1 square wave reference signals controlled by a clock running at the carrier frequency $F_c$ is used to split the pickoff signal into in-phase and quadrature phase components. The in-phase signal is passed through a low pass filter (LPF) so as to reduce its bandwidth before being passed to a downstream ADC for digitization. Such a system can achieve the required phase accuracy but has the disadvantage that odd harmonic distortion of a signal and noise at odd harmonic frequencies are accepted by the demodulator, which degrades the performance of the processing system. FIG. 4a illustrates the noise considerations that must be taken into account, FIG. 4b shows the odd harmonics introduced by a simple +/−1 synchronous demodulator, and FIG. 4c shows how the information carried by the pickoff signal is transformed to base bands by such a +/−1 demodulation. These limitations are generally acceptable for low performance systems but become a dominant source of error when high performance is required.

The quadrature error arising due to inherent fabrication imperfections is a major challenge in the development of accurate MEMS sensors such as gyroscopes. In order to provide the necessary signal conditioning to implement the complex compensation algorithms required to produce a high performance system, a digital (e.g. software-based) implementation is generally preferred. Most high performance sensor systems therefore need to use a digital implementation and this generally requires the inherently analog sensor output to be digitized first. This is typically achieved by using an unsynchronized analog-to-digital convertor (ADC) which directly digitizes the amplitude-modulated carrier signal generated by a pickoff transducer. A problem with direct digitization of the pickoff signal is that a very high speed ADC is required and this limits the dynamic range available (number of bits), and that large and complex processing is needed in order to accurately extract the amplitude modulation information while simultaneously resolving the phase information sufficiently to reject the large quadrature component. While this can provide a route to high performance if implemented in discrete component form, it makes it difficult and costly to integrate using a general purpose ASIC (application-specific integrated circuit) process. ASIC technology is usually used for its compatibility with small and cheap MEMS sensors.

There remains a need for improved signal processing systems and methods for sensors such as a MEMS sensor, especially a vibrating structure gyroscope, that do not suffer from the issues outlined above.

SUMMARY

There is disclosed herein a method of processing an amplitude-modulated analog signal at a carrier frequency $F_c$, comprising:

digitizing the analog signal to produce an input bit stream that represents the amplitude of the analog signal;

generating an in-phase reference bit stream that is synchronous to the carrier frequency $F_c$ and represents an in-phase digital reference signal substantially in the form of a sine and/or cosine wave; and multiplying the input bit stream with the in-phase reference bit stream to produce an output bit stream representing the amplitude modulation of the analog signal.

It will be appreciated that such a method carries out synchronous demodulation in the digital domain rather than in the analog domain. The output bit stream representing the amplitude modulation of the analog signal is more accurate because odd harmonic distortion in the signal can be rejected by the digitally-generated sine/cosine wave reference signal. This is valid up to the Nyquist frequency of the sampling rate of the demodulating sine/cosine wave. Furthermore there is achieved a reduction in noise because noise images occurring at the odd harmonics of the carrier frequency are not folded back into base band frequencies, as occurs with a simple +/−1 (square wave) synchronous demodulator operating in the analog domain—see FIG. 4C. By digitally generating an in-phase digital reference signal, phase accuracy matching can be near perfect.

Such a method can be applicable to any amplitude-modulated analog carrier signal, for example generated by an accelerometer or radio communications device. However a Coriolis gyroscope is a particularly difficult example because it needs accurate recovery of DC components (and sidebands up to few hundred Hz), rejection of quadrature DC components, and low noise and rejection of harmonics. Other amplitude-modulated analog systems may not need quadrature rejection e.g. non-resonant accelerometers, or may not need DC performance e.g. radio communications (just 20 Hz to 20 kHz bandwidth). The output bit stream is ideally suited for high performance systems, in particular implemented in a ASIC form.

By generating an in-phase reference bit stream that is synchronous to the carrier frequency $F_c$, the modulation scheme produces a digital data stream which represents the analog signal in the real time domain. Any analog-to-digital (ADC) architecture can be used to digitize the analog carrier signal provided that the sample conversion is synchronous to the demodulating bit stream. Typically there is a trade-off between ADC speed and the number of bits in the resulting input bit steam. However the ADC sampling rate can be important to ensure rejection of odd harmonics that can otherwise corrupt the amplitude information of interest. The method may include digitizing the analog signal at a sampling rate R that is synchronous to the carrier frequency $F_c$ according to $R=(1*3*5 \ldots N)*F_c$, where N>1 is an odd number representing odd harmonics in the analog signal. In other words, the ADC sampling rate can be chosen to accurately represent the fundamental and harmonic signals which is it desired to reject.

In practice, a minimum digitization or sampling rate of $2*F_c$ is required to meet the Nyquist criterion. Accordingly the method may comprise digitizing the analog signal at a sampling rate R that is synchronous to the carrier frequency $F_c$, according to $R=2*(1*3*5 \ldots N)*F_c$, where N>1 is an odd number representing odd harmonics in the analog signal.

In order to enable real and quadrature phase signals to be separated, a digitization or sampling rate of $4*F_c$ may be used. Accordingly the method may comprise digitizing the analog signal at a sampling rate R that is synchronous to the carrier frequency $F_c$, according to $R=4*(1*3*5 \ldots N)*F_c$, where N>1 is chosen as an odd number representing odd harmonics in the analog signal.

In order to reject the N=3 harmonic there is chosen a sampling rate $R=4*3*F_c=12F_c$, to reject the N=5 harmonic there is chosen a sampling rate $R=4*5*F_c=20F_c$, to reject both the N=3 and N=5 harmonics there is chosen a sampling rate $R=4*3*5*F_c=60F_c$, to reject the N=3, N=5 and N=7 harmonics there is chosen a sampling rate $R=4*3*5*7*F_c=420F_c$, etc.

Any suitable digitization scheme may be used. In one example the method comprises digitizing the analog signal using pulse-density modulation (PDM) or pulse-width modulation (PWM). In a PDM signal, the relative density of the pulses corresponds to the analog signal's amplitude. Pulse-width modulation (PWM) is a special case of PDM where all the pulses corresponding to one sample are contiguous in the digital signal. A PDM or PWM signal may be generated by carrying out delta-sigma modulation to produce a one-bit input bit stream.

In one example the method comprises digitizing the analog signal using pulse-code modulation (PCM). In a PCM signal, specific amplitude values are encoded into pulses of different size. A PCM signal may be generated by carrying out multi-bit conversion to produce a multi-bit input bit stream. With a PCM method the multiplication and filtering of digital signals can become more complicated i.e. processor intensive. However, the Applicant has recognized that it may be beneficial to convert an analog carrier signal into a multi-bit input bit stream and then apply digital sine/cosine wave demodulation using a multi-bit reference signal. Thus in one example the method may comprise generating a multi-bit in-phase reference bit stream that is synchronous to the carrier frequency $F_c$.

There is disclosed herein a method of processing an amplitude-modulated analog signal at a carrier frequency $F_c$, comprising:

digitizing the analog signal to produce a multi-bit input bit stream that represents the amplitude of the analog signal;

generating a multi-bit in-phase reference bit stream that is synchronous to the carrier frequency $F_c$ and represents an in-phase digital reference signal substantially in the form of a sine and/or cosine wave; and multiplying the multi-bit input bit stream with the multi-bit in-phase reference bit stream to produce an output bit stream representing the amplitude modulation of the analog signal.

Such a method can be used to produce a x-bit input bit stream that is multiplied by a z-bit reference bit stream to provide a x*z-bit result. This may provide high performance, albeit at the expense of high processor demands.

In one example, the method may comprise digitizing the analog signal using pulse-code modulation (PCM).

The signal processing methods described above may further be used to determine a quadrature component of the analog carrier signal. The method may further comprise: generating a quadrature reference bit stream that is synchronous to the carrier frequency $F_c$ and represents a quadrature digital reference signal substantially in the form of a cosine and/or sine wave; and multiplying the input bit stream with the quadrature reference bit stream to produce an output bit stream representing a quadrature component of the analog signal. The quadrature digital reference signal may be orthogonal to the in-phase digital reference signal, for example one is a sine wave and the other is a cosine wave, or vice versa. In one example, the method may comprise generating a synchronous pair of in-phase and quadrature reference bit streams.

There is further disclosed herein a pickoff signal processing system for a sensor comprising a movement sensing structure, the system comprising: an analog-to-digital converter (ADC) arranged to digitize an amplitude-modulated analog pickoff signal representing movement of the sensing structure which is at a carrier frequency $F_c$ and produce an input bit stream that represents the amplitude of the analog pickoff signal; a synchronous modulator or look-up table arranged to generate an in-phase reference bit stream that is synchronous to the carrier frequency $F_c$ and represents an in-phase digital reference signal substantially in the form of a sine and/or cosine wave; and logic means arranged to multiply the input bit stream with the in-phase reference bit stream and produce an output bit stream representing the amplitude modulation of the analog pickoff signal.

For the reasons discussed above, the ADC may be arranged to digitize the analog pickoff signal at a sampling rate R that is synchronous to the carrier frequency $F_c$ according to R=2*(1*3*5 ... N)*$F_c$, where N>1 is an odd number representing odd harmonics in the analog signal. In one example, the ADC is arranged to digitize the analog pickoff signal at a sampling rate R that is synchronous to the carrier frequency $F_c$ according to R=4*(1*3*5 ... N)*$F_c$, where N>1 is chosen as an odd number representing odd harmonics in the analog signal. For example, the ADC may be arranged to digitize the analog pickoff signal at a sampling rate R=4*3*$F_c$=12$F_c$ or R=4*3*5*$F_c$=60$F_c$.

Optionally, the ADC is arranged to digitize the analog pickoff signal using pulse-density modulation (PDM) or pulse-width modulation (PWM). The ADC may be arranged to carry out delta-sigma modulation to produce a one-bit input bit stream.

Optionally, the ADC is arranged to digitize the analog pickoff signal using pulse-code modulation (PCM). The ADC may be arranged to carry out multi-bit conversion to produce a multi-bit input bit stream.

There is further disclosed herein a pickoff signal processing system for a sensor comprising a movement sensing structure, the system comprising: an analog-to-digital converter (ADC) arranged to digitize an amplitude-modulated analog pickoff signal representing movement of the sensing structure which is at a carrier frequency $F_c$ and produce a multi-bit input bit stream that represents the amplitude of the analog pickoff signal; a synchronous modulator or look-up table arranged to generate a multi-bit in-phase reference bit stream that is synchronous to the carrier frequency $F_c$ and represents an in-phase digital reference signal substantially in the form of a sine and/or cosine wave; and logic means arranged to multiply the multi-bit input bit stream with the multi-bit in-phase reference bit stream and produce an output bit stream representing the amplitude modulation of the analog pickoff signal.

In such a system the ADC may be arranged to digitize the analog pickoff signal using pulse-code modulation (PCM).

Advantageously the pickoff signal processing system is fully synchronous. This can be particularly suited for a vibrating structure sensor such as a Coriolis gyroscope.

In one example, the synchronous modulator or look-up table is arranged to generate a quadrature reference bit stream that is synchronous to the carrier frequency $F_c$ and represents a quadrature digital reference signal substantially in the form of a cosine and/or sine wave, and the logic means is arranged to multiply the input bit stream with the quadrature reference bit stream to produce an output bit stream representing a quadrature component of the analog signal. The quadrature digital reference signal may be orthogonal to the in-phase digital reference signal, for example one is a sine wave and the other is a cosine wave, or vice versa. The synchronous modulator or look-up table may be arranged to generate a synchronous pair of in-phase and quadrature reference bit streams. For example, the logic means may be arranged to multiply a PDM digital signal with a quadrature reference PDM digital signal and produce a quadrature output digital signal in the form of an output bit stream representing the quadrature bias of the analog pickoff signal.

Optionally, further signal processing steps may be carried out downstream of the synchronous demodulator. In one example, the method or system further comprises means to accumulate the output bit stream(s) e.g. by summing consecutive samples of the output bit stream(s). In addition, or alternatively, the method or system may further comprise means to filter the output bit stream(s). The filter means may comprise a low pass filter. In addition, or alternatively, the method or system may further comprise means to decimate the output bit stream(s). One or more such additional processing steps can help to reduce the data rate so as to be suitable for a bandwidth of interest.

Any suitable form of ADC may be provided that can produce a digital bit stream representing the analog pickoff signal as a pulse-density modulated (PDM) waveform. In a particularly convenient arrangement, the ADC is arranged to carry out delta-sigma modulation so as to produce a one-bit pulse-density modulation (PDM) digital signal. Such delta-sigma modulation has become a popular method for encoding analog signals into digital signals as such one-bit converters are very fast and easy to make accurate by modern methods e.g. on an ASIC. For example, the delta-sigma modulation may convert the analog voltage of an analog pickoff signal into a pulse frequency and count the pulses in a known interval so that the pulse count provided by the interval gives an accurate digital representation of the mean analog voltage. The count interval can be chosen to give any desired resolution or accuracy.

As is mentioned above, any suitable ADC architecture can be used, other than delta-sigma modulation, providing the digital conversion is synchronous with the demodulating reference signal(s). In one example, the ADC has a resolution of at least one bit. However, it will be appreciated that any suitable resolution may be chosen, for example 2-bit, 4-bit, 8-bit, 16-bit, etc. Typically the trade-off of ADC speed vs. number of bits is the limiting factor. In practice the optimum solution may depend on the speed of the available ADC.

The sampling rate of the ADC may be set at any suitable level which is synchronous to the resonator frequency. This may take into account for example, the power available for the signal processing system. In one example, the ADC performs high speed sampling, e.g. at a sampling rate of 60 times the carrier frequency $F_c$, as this will enable $3^{rd}$ and $5^{th}$ harmonic noise to be rejected while still accurately recovering the in-phase and quadrature components of the analog signal. This may be particularly important for the resonant signal generated by a vibrating structure sensor such as a vibrating gyroscope.

Operation of the synchronous modulator in the digital domain may be controlled so as to maximize the phase accuracy of the signal processing method or system. In one example, the synchronous modulator utilizes a clock running at a multiple N of the carrier frequency $F_c$ of the analog signal, i.e. a clock speed of $N*F_c$. By suitable selection of the multiple N, a high speed clock is easily able to provide for near absolute phase accuracy. In addition, or alternatively, the synchronous modulator or look-up table may utilize a clock controlled relative to the ADC so as to skew the timing to achieve phase accuracy. In other words, any errors in the phase accuracy can be compensated by skewing the timing of the digitally-generated demodulating sine wave and/or cosine wave.

Methods and systems described herein may find use in any sensor technology that has information on amplitude-modulated analog carrier signals, in particular where DC performance is required and quadrature signals are present. The present disclosure includes a sensor comprising a movement sensing structure and a pickoff signal processing system as described hereinabove. In one example, the movement sensing structure may comprise a vibrating sensing structure.

The present disclosure extends to a sensor comprising a vibrating sensing structure and a pickoff signal processing system as described hereinabove. The sensor may comprise any kind of vibrating sensing structure that can be operated using a cos 2θ vibration mode pair. In one set of examples the MEMS sensor may be a resonant mass sensor detector comprising a circular disc resonator. Such a mass detector may measure the frequency split produced in the cos 2θ vibration modes resulting from thermally-induced stress or strain variations. These variations can affect a mass detector's sensitivity in applications such as medical diagnostics and drug discovery.

In one set of examples the sensor may be a vibrating structure gyroscope, in particular a gyroscope comprising a substantially planar annular resonator. The annular resonator may be supported on a semiconductor substrate by a plurality of flexible support members that allow the annular resonator to oscillate in one or more in-plane resonance modes. The semiconductor substrate and annular resonator may be made of silicon. The semiconductor substrate, the annular resonator and the support members may be arranged substantially co-planar with one another, for example fabricated from the same silicon wafer using a deep reactive ion etch (DRIE) process.

The sensor may comprise a pickoff transducer generating the amplitude modulated analog pickoff signal at the carrier frequency $F_c$. For example, the pickoff signal may be a voltage detected by the transducer. The pickoff transducer can use any suitable means, for example capacitive sensing, piezoelectric or electromagnetic i.e. inductive sensing. In one set of examples the pickoff transducer comprises at least one inductive pickoff transducer. In a vibrating ring gyroscope, the inductive pickoff transducer may be constituted by conductive track(s) on the annular resonator and the support members.

The sensor may comprise a drive transducer arranged to cause the vibrating sensing structure to vibrate in a primary in-plane resonance mode that is a cos 2θ resonance mode. The drive transducer can use any suitable drive means, for example electromagnetic, optical, thermal expansion, piezoelectric or electrostatic effects.

In examples of any sensor mentioned above, the sensor(s) may be made as a MEMS structure.

BRIEF DESCRIPTION OF THE DRAWINGS

FIG. 4a illustrates the noise considerations in a prior art analog signal processing system;

FIG. 4b illustrates the odd harmonics produced by a simple analog demodulator;

FIG. 4c illustrates the results of analog demodulation according to the prior art;

FIG. 6a illustrates the noise considerations in the present disclosure;

FIG. 6b illustrates the harmonics produced by a sine/cosine wave demodulator; and FIG. 6c illustrates the results of sine/cosine wave demodulation according to the present disclosure.

DETAILED DESCRIPTION

Figure 1:
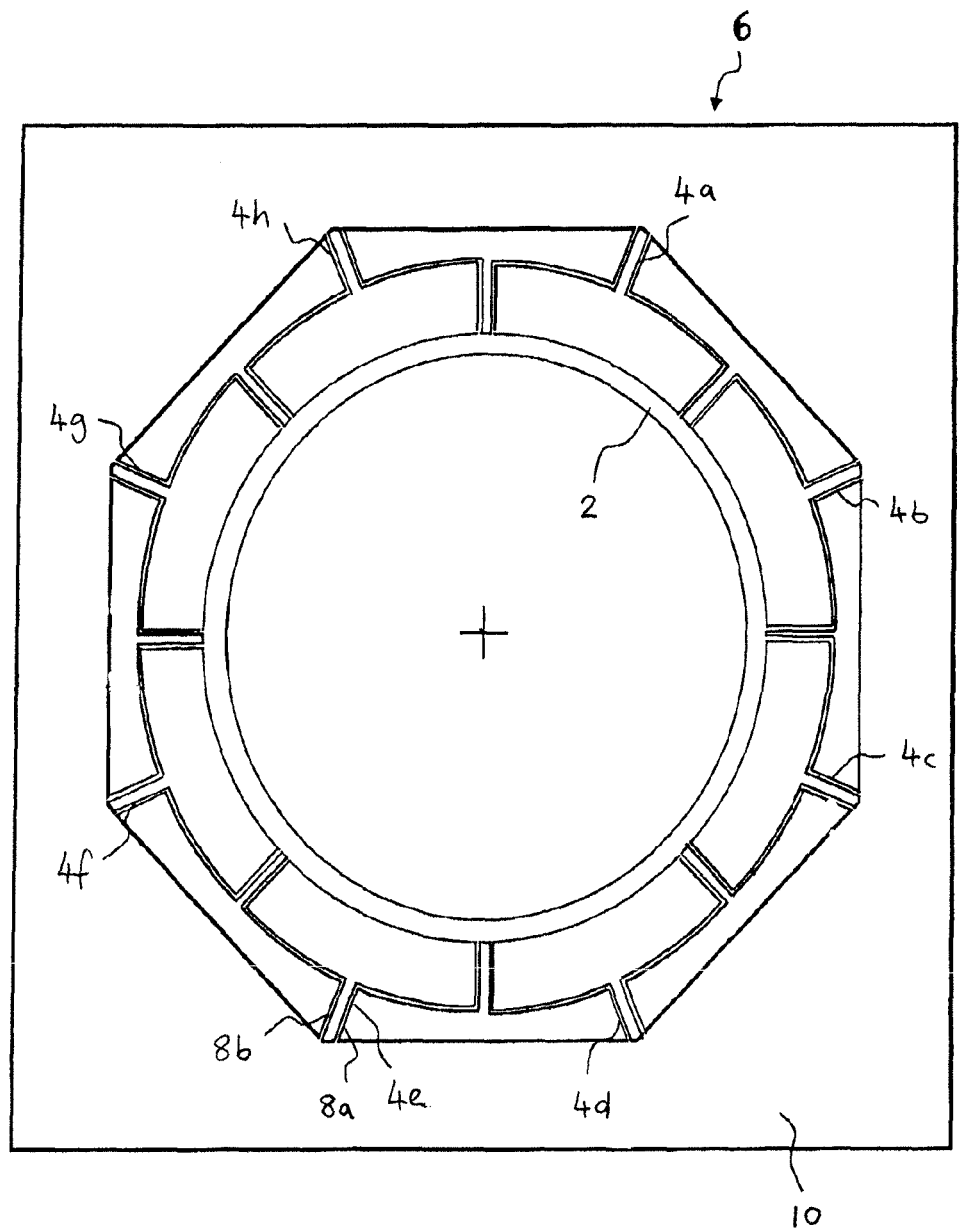
FIG. 1 shows a prior art arrangement of a MEMS sensor comprising an annular resonator.

FIG. 1 shows an example of a prior art vibrating structure gyroscope comprising an annular resonator 2 mounted by 8 flexible supports 4a to 4h arranged to retain the annular resonator 2 within a semiconductor substrate 6. Each of the flexible supports for 4a to 4h includes a pair of compliant legs 8a, 8b that are attached at one end to the external periphery of the annular resonator 2 and at the other end to the internal periphery of a support frame 10 defined by the substrate 6. The flexible supports 4a to 4h allow the annular resonator 2 to vibrate in response to electromagnetic drive transducers (not shown) constituted by metal track sections on two of the supports. Primary and secondary pairs of inductive pickoff transducers (not shown) are constituted by metal track sections on other of the supports.

Figure 2:
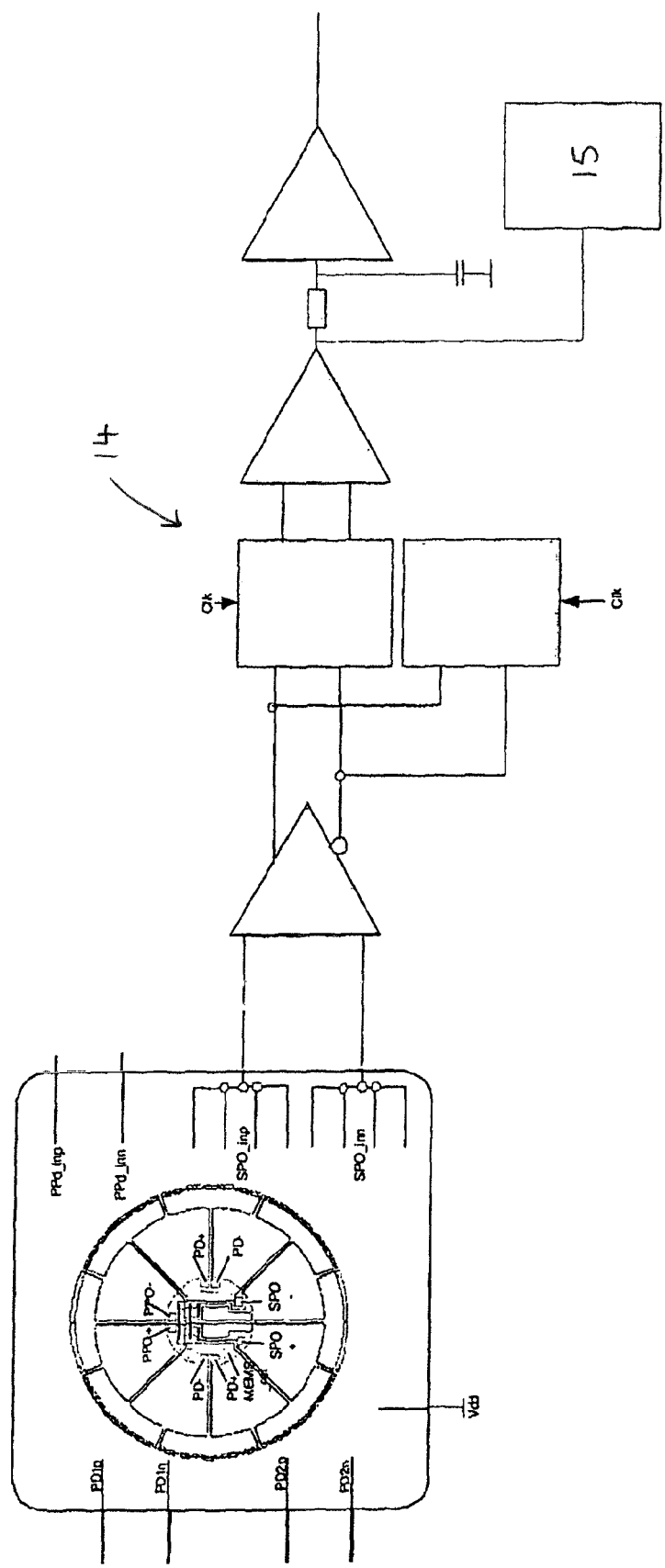
FIG. 2 is a schematic diagram showing parts of the signal processing electronics for a MEMS sensor according to the prior art.
Figure 3:
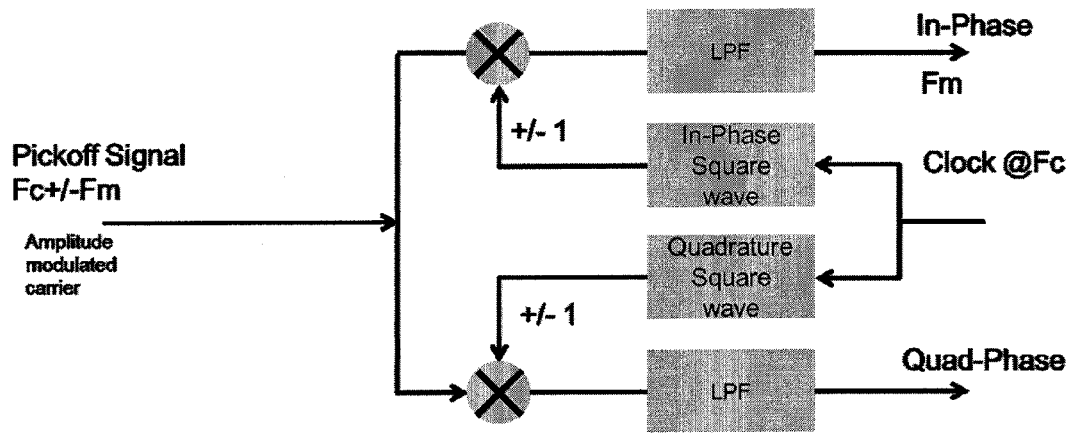
FIG. 3 is a schematic diagram of an analog signal processing system according to the prior art.

FIG. 2 shows a secondary pickoff differential transducer signal being input to a rate channel including a synchronous detector 14. The synchronous detector 14 outputs an offset relative to the amplitude of the differential signal which is filtered and converted into a single ended offset on the rate output signal and input to an analog-to-digital converter (ADC) 15. The ADC then outputs a digital signal representative of the movement of the annular resonator 2. In such an analog signal processing system, a simple +/−1 i.e. square wave synchronous demodulator extracts the modulation information from the analog pickoff signal, as is illustrated by FIG. 3. The noise considerations and signal distortion are illustrated in FIGS. 4a to 4c. In FIG. 4a the amplitude modulation information is carried by a signal at a carrier frequency $F_c$ of 14 kHz. Broadband white noise is present, resulting in noise images at $3F_c$ (42 kHz) and $5F_c$ (70 kHz). FIG. 4b shows the odd harmonics resulting from a simple +/−1 i.e. square wave synchronous demodulator. FIG. 4c shows how the information is transformed to baseband but corrupted by the broadband white noise and distortion. As can be seen from FIGS. 4a to 4c, such a demodulator accepts odd harmonic distortion of the signal and noise at odd harmonic frequencies, which means that the performance of the system is degraded.

Figure 5:
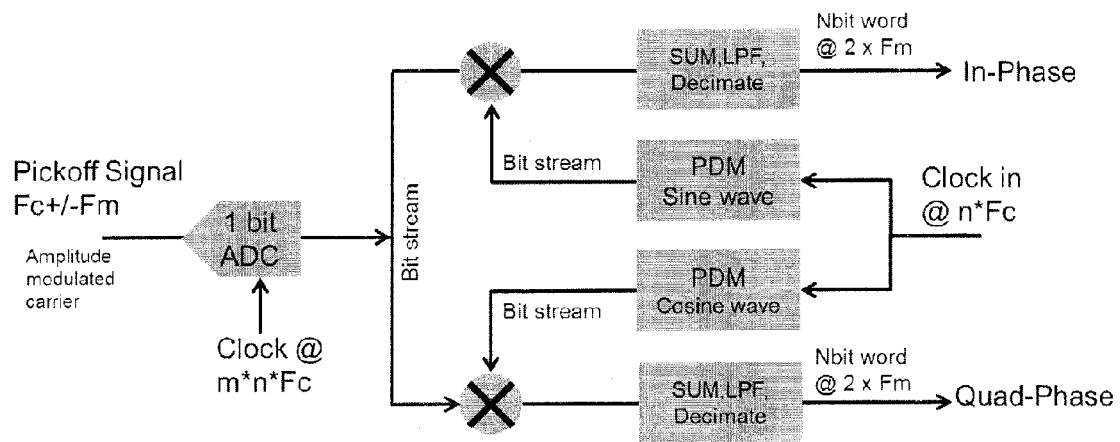
FIG. 5 is a schematic diagram illustrating a pickoff digitization system according to the present disclosure.

Turning to FIG. 5, there is seen a pickoff signal processing system using a high speed, one-bit, analog-to-digital converter (ADC) to produce a digital bit stream that represents the amplitude modulation of the input carrier signal at frequency $F_c$ as a pulse-density modulated (PDM) waveform. The ADC can conveniently employ delta-sigma modulation. A pair of in-phase and quadrature reference pulse-density modulated sine/cosine waves, e.g. a PDM sine wave and a PDM cosine wave, are synthesized by logic run from a synchronous clock. The clock may run at a high frequency of $N*F_c$. The demodulating sine/cosine waves are digitally generated and may provide an approximation to a sine/cosine wave using an appropriate number of harmonics. The two synchronous digital reference bit streams are multiplied together with the input PDM digital signal using combinational logic, for example exclusive OR gates. The synchronous demodulator thereby produces an output bit stream representing the amplitude information contained within the original analog pickoff signal and another output bit stream representing any quadrature bias in the carrier signal. As is shown, the output bit stream that is in-phase may then be filtered, summed, and decimated to produce an accurate representation of the amplitude modulation but advantageously at a low data rate suitable for the bandwidth of interest. A low pass filter (LPF) can be employed to separate information at the baseband. The output bit stream that is quadrature-phase may optionally be used to measure any quadrature bias.

FIGS. 6a to 6c illustrate how noise considerations are handled by such a sine/cosine wave demodulation method. In FIG. 6a the amplitude-modulated analog signal at a carrier frequency $F_c$ is the same as in FIG. 4a. However, in FIG. 6b it can be seen that there are no odd harmonics generated. As a result, only the required information is transformed to baseband, as is shown in FIG. 6c.

The system shown in FIG. 5 relates to one-bit digitization but the same technique can be extended to a generalized x-bit ADC output multiplied by a z-bit reference bit stream, where x≥1 and z≥1. In such examples x would be a multi-bit representation of the demodulating reference sine/cosine waves and the product of the two would be a x*z-bit result. Instead of pulse-density modulation (PDM) or pulse-width modulation (PWM), the ADC may employ pulse-code modulation (PCM) for multi-bit conversion. This would result in high performance but may be intensive in terms of processing and the high speed required of the ADC.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of processing an amplitude-modulated analog signal at a carrier frequency $F_c$, comprising:
    digitizing the analog signal at a sampling rate R that is synchronous to the carrier frequency $F_c$ to produce an input bit stream that represents the amplitude of the analog signal, wherein $R=2*(1*3*5 \ldots N)*F_c$ or $R=4*(1*3*5 \ldots N)*F_c$, where N>1 is an odd number representing odd harmonics in the analog signal;
    generating an in-phase reference bit stream that is synchronous to the carrier frequency $F_c$ and represents an in-phase digital reference signal substantially in the form of a sine and/or cosine wave; and
    multiplying the input bit stream with the in-phase reference bit stream to produce an output bit stream representing the amplitude modulation of the analog signal.

2. The method of claim 1, comprising digitizing the analog signal at a sampling rate $R=4*3*F_c=12F_c$ or $R=4*3*5*F_c=60F_c$.

3. The method of claim 1, wherein digitizing the analog signal is performed using pulse-density modulation (PDM) or pulse-width modulation (PWM).

4. The method of claim 1, wherein digitizing the analog signal comprises carrying out delta-sigma modulation to produce a one-bit input bit stream.

5. The method of claim 1, wherein digitizing the analog signal is performed using pulse-code modulation (PCM).

6. The method of claim 1, wherein digitizing the analog signal comprises carrying out multi-bit conversion to produce a multi-bit input bit stream.

7. The method of claim 1, comprising generating a multi-bit in-phase reference bit stream that is synchronous to the carrier frequency $F_c$.

8. The method of claim 1, further comprising:
    generating a quadrature reference bit stream that is synchronous to the carrier frequency $F_c$ and represents a quadrature digital reference signal substantially in the form of a cosine and/or sine wave; and
    multiplying the input bit stream with the quadrature reference bit stream to produce an output bit stream representing a quadrature component of the analog signal.

9. The method of claim 8, comprising generating a pair of synchronous in-phase and quadrature reference bit streams.

10. The method of claim 1, wherein generating an in-phase reference bit stream that is synchronous to the carrier frequency $F_c$ comprises controlling a clock so as to skew the timing to achieve phase accuracy.

11. A pickoff signal processing system for a sensor comprising a movement sensing structure, the system comprising:
    an analog-to-digital converter (ADC) arranged to digitize an amplitude-modulated analog pickoff signal representing movement of the sensing structure which is at a carrier frequency $F_c$ and produce an input bit stream that represents the amplitude of the analog pickoff signal, wherein the ADC is arranged to digitize the analog pickoff signal at a sampling rate R that is synchronous to the carrier frequency $F_c$ according to $R=2*(1*3*5 \ldots N)*F_c$ or $R=4*(1*3*5 \ldots N)*F_c$, where N>1 is an odd number representing odd harmonics in the analog signal;
    a synchronous modulator or look-up table arranged to generate an in-phase reference bit stream that is synchronous to the carrier frequency $F_c$ and represents an in-phase digital reference signal substantially in the form of a sine and/or cosine wave; and logic means arranged to multiply the input bit stream with the in-phase reference bit stream and produce an output bit stream representing the amplitude modulation of the analog pickoff signal.

12. The system of claim 11, wherein the ADC is arranged to digitize the analog pickoff signal at a sampling rate $R=4*3*F_c=12F_c$ or $R=4*3*5*F_c=60F_c$.

13. The system of claim 11, wherein the ADC is arranged to digitize the analog pickoff signal using pulse-density modulation (PDM), or pulse-width modulation (PWM), or pulse-code modulation (PCM).

14. The system of claim 11, wherein the ADC is arranged to carry out delta-sigma modulation to produce a one-bit input bit stream.

15. The system of claim 11, wherein the ADC is arranged to carry out multi-bit conversion to produce a multi-bit input bit stream.

16. The system of claim 11, wherein:
the synchronous modulator or look-up table is arranged to generate a quadrature reference bit stream that is synchronous to the carrier frequency $F_c$ and represents a quadrature digital reference signal substantially in the form of a cosine and/or sine wave; and
the logic means is arranged to multiply the input bit stream with the quadrature reference bit stream to produce an output bit stream representing a quadrature component of the analog signal.

17. The system of claim 16, wherein the synchronous modulator or look-up table is arranged to generate a synchronous pair of in-phase and quadrature reference bit streams.

18. The system of claim 11, wherein the synchronous modulator or look-up table utilizes a clock controlled relative to the ADC so as to skew the timing to achieve phase accuracy.

* * * * *